US012463008B2

(12) United States Patent
Li et al.

(10) Patent No.: US 12,463,008 B2
(45) Date of Patent: Nov. 4, 2025

(54) CHARGED PARTICLE BEAM SCANNING MODULE, CHARGED PARTICLE BEAM DEVICE, AND COMPUTER

(71) Applicant: Hitachi High-Tech Corporation, Tokyo (JP)

(72) Inventors: Wen Li, Tokyo (JP); Shinichi Murakami, Tokyo (JP); Hiroyuki Takahashi, Tokyo (JP); Makoto Suzuki, Tokyo (JP); Wataru Mori, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 414 days.

(21) Appl. No.: 17/872,046

(22) Filed: Jul. 25, 2022

(65) Prior Publication Data

US 2023/0036590 A1 Feb. 2, 2023

(30) Foreign Application Priority Data

Aug. 2, 2021 (JP) ................................ 2021-126744

(51) Int. Cl.
*H01J 37/26* (2006.01)
*H01J 37/147* (2006.01)
(Continued)

(52) U.S. Cl.
CPC .......... *H01J 37/265* (2013.01); *H01J 37/222* (2013.01); *H01J 37/244* (2013.01); *H01J 37/28* (2013.01); *H01J 2237/2817* (2013.01)

(58) Field of Classification Search
CPC ...... H01J 37/265; H01J 37/222; H01J 37/244; H01J 37/28; H01J 2237/2817;
(Continued)

(56) References Cited

U.S. PATENT DOCUMENTS

| | | | |
|---|---|---|---|
| 5,502,306 A | 3/1996 | Meisburger et al. |
| 9,461,661 B1 | 10/2016 | Kull et al. |
| 2020/0382129 A1 | 12/2020 | Kubo et al. |

FOREIGN PATENT DOCUMENTS

| | | | |
|---|---|---|---|
| JP | 2004087483 A | | 3/2004 |
| JP | 2020198524 A | | 12/2020 |
| KR | 20110061009 A | * | 6/2011 |

OTHER PUBLICATIONS

English Translation of KR20110061009A (Year: 2011).*

* cited by examiner

*Primary Examiner* — David E Smith
*Assistant Examiner* — Laura Eloise Tandy
(74) *Attorney, Agent, or Firm* — Mattingly & Malur, PC

(57) ABSTRACT

A charged particle beam scanning module, a charged particle beam device, and a computer that can correct an INL error in a DAC circuit in real time. The charged particle beam scanning module includes a scanning controller configured to output a scanning digital signal of a charged particle beam, a DAC circuit configured to convert the scanning digital signal into a scanning analog signal and output the scanning analog signal, and an ADC circuit configured to convert the scanning analog signal into an evaluation digital signal. A sampling frequency at which the DAC circuit samples the scanning digital signal is a first frequency, and a sampling frequency at which the ADC circuit samples the scanning analog signal is a second frequency smaller than the first frequency. The scanning controller determines an output characteristic of the DAC circuit by evaluating the scanning digital signal and the evaluation digital signal.

17 Claims, 7 Drawing Sheets

(51) Int. Cl.

| | |
|---|---|
| ***H01J 37/22*** | (2006.01) |
| ***H01J 37/244*** | (2006.01) |
| ***H01J 37/28*** | (2006.01) |

(58) Field of Classification Search

CPC ........... H01J 37/1474; H01J 2237/1504; H01J 2237/2826; H01J 37/147; H01J 37/1472

See application file for complete search history.

$$\begin{bmatrix} P11(\delta X,\delta Y), & P21(\delta X,\delta Y), & \cdots & Pn1(\delta X,\delta Y) \\ P12(\delta X,\delta Y), & P22(\delta X,\delta Y), & \cdots & Pn2(\delta X,\delta Y) \\ \vdots & \vdots & \ddots & \vdots \\ P1m(\delta X,\delta Y), & P2m(\delta X,\delta Y), & \cdots & Pnm(\delta X,\delta Y) \end{bmatrix}$$

CHARGED PARTICLE BEAM SCANNING MODULE, CHARGED PARTICLE BEAM DEVICE, AND COMPUTER

CROSS-REFERENCE TO RELATED APPLICATION

The present application claims priority from Japanese application JP 2021-126744, filed on Aug. 2, 2021, the contents of which is hereby incorporated by reference into this application.

BACKGROUND OF THE INVENTION

1. Field of the Invention

The present invention relates to a charged particle beam scanning module, a charged particle beam device, and a computer.

2. Description of the Related Art

A charged particle beam device is a device that acquires information about a sample by irradiating the sample with charged particles and detecting secondary electrons. The charged particle beam device includes a charged particle beam scanning module for scanning the sample with a charged particle beam.

In the charged particle beam scanning module, a digital signal from a scanning controller is converted into an analog signal by a digital-to-analog conversion circuit (DAC circuit), and a charged particle beam is deflected in accordance with the analog signal and is radiated to a desired position of the sample.

An error may occur at the time of converting the digital signal in the DAC circuit. This error includes an integral non-linearity error (hereinafter referred to as an "INL error"). The INL error occurs due to, for example, a temporal change, a temperature change, and other environmental changes. The INL error influences linearity of a relationship between a time and an irradiation position during scanning a sample with the charged particle beam, and the INL error appears as, for example, a change (expansion and contraction or the like) in a dimension on an image. Therefore, a measurement error of the dimension may be different depending on a position of the sample, and uniformity in the image may be impaired.

As a technique for correcting an irradiation error of a charged particle beam, for example, JP-A-2004-87483 (Patent Literature 1) discloses a configuration for correcting deflection of a charged particle beam using an interferometer.

A configuration shown in FIG. 1 is known as a technique for correcting an INL error of a DAC circuit. A digital signal from the DAC circuit is supplied to an amplifier circuit at the time of scanning and is used for deflecting the charged particle beam. On the other hand, the digital signal is supplied to an analog-to-digital conversion circuit (ADC circuit) during a correction operation.

The ADC circuit converts an analog signal into a digital signal and feeds back the digital signal to a scanning controller. The scanning controller corrects an error of the digital signal based on a difference between the digital signal output to the DAC circuit and the digital signal input from the ADC circuit.

The technique in the related art has a problem in that it is difficult to correct the INL error in the DAC circuit in real time.

For example, the configuration disclosed in Patent Literature 1 corrects the deflection of the charged particle beam as a result, but does not correct the INL error of the DAC circuit.

In the configuration shown in FIG. 1, it is difficult to perform scanning and a correction of the charged particle beam at the same time. Since a time required for a conversion operation of the ADC circuit is longer than a time required for a conversion operation of the DAC circuit, the conversion operation of the ADC circuit cannot follow a change in a high-speed digital signal as in normal scanning. Therefore, it is required to control the digital signal at a low speed in order to perform the correction operation, and scanning using the charged particle beam cannot be performed as usual, so that throughput of the charged particle beam device is reduced.

SUMMARY OF THE INVENTION

In order to solve such problems, an object of the present invention is to provide a charged particle beam scanning module, a charged particle beam device, and a computer that can correct an INL error in a DAC circuit in real time.

An example of a charged particle beam scanning module according to the present invention includes

- a scanning controller configured to output a scanning digital signal of a charged particle beam,
- a DAC circuit configured to convert the scanning digital signal into a scanning analog signal and output the scanning analog signal, and
- an ADC circuit configured to convert the scanning analog signal into an evaluation digital signal.

A sampling frequency at which the DAC circuit samples the scanning digital signal is a first frequency,

- a sampling frequency at which the ADC circuit samples the scanning analog signal is a second frequency smaller than the first frequency, and
- the scanning controller determines an output characteristic of the DAC circuit by evaluating the scanning digital signal and the evaluation digital signal.

An example of a charged particle beam device according to the present invention includes a charged particle beam scanning module.

The charged particle beam scanning module includes

- a scanning controller configured to output a scanning digital signal of a charged particle beam,
- a DAC circuit configured to convert the scanning digital signal into a scanning analog signal and output the scanning analog signal, and
- an ADC circuit configured to convert the scanning analog signal into an evaluation digital signal.

A sampling frequency at which the DAC circuit samples the scanning digital signal is a first frequency,

- a sampling frequency at which the ADC circuit samples the scanning analog signal is a second frequency smaller than the first frequency, and
- the scanning controller determines an output characteristic of the DAC circuit by evaluating the scanning digital signal and the evaluation digital signal.

The charged particle beam device further includes

- a charged particle source configured to generate the charged particle beam, a detector configured to detect secondary electrons generated in response to irradiation on a sample using the charged particle beam, and a sample image generation device configured to generate a sample image based on the detected secondary electrons.

An example of a computer according to the present invention can communicate with a charged particle beam device.

The charged particle beam device includes a charged particle beam scanning module.

The charged particle beam scanning module includes a scanning controller configured to output a scanning digital signal of a charged particle beam, a DAC circuit configured to convert the scanning digital signal into a scanning analog signal and output the scanning analog signal, and an ADC circuit configured to convert the scanning analog signal into an evaluation digital signal.

A sampling frequency at which the DAC circuit samples the scanning digital signal is a first frequency, a sampling frequency at which the ADC circuit samples the scanning analog signal is a second frequency smaller than the first frequency, and the scanning controller determines an output characteristic of the DAC circuit by evaluating the scanning digital signal and the evaluation digital signal.

The charged particle beam device further includes a charged particle source configured to generate the charged particle beam, a detector configured to detect secondary electrons generated in response to irradiation on a sample using the charged particle beam, and a sample image generation device configured to generate a sample image based on the detected secondary electrons.

The computer includes a storage medium configured to store information, and a processor.

The processor receives the sample image and information indicating the output characteristic from the charged particle beam device.

According to the technique of the present invention, an INL error in the DAC circuit can be corrected in real time.

DESCRIPTION OF THE PREFERRED EMBODIMENTS

Embodiments of the present invention will be described below with reference to accompanying drawings.

First Embodiment

Figure 1:
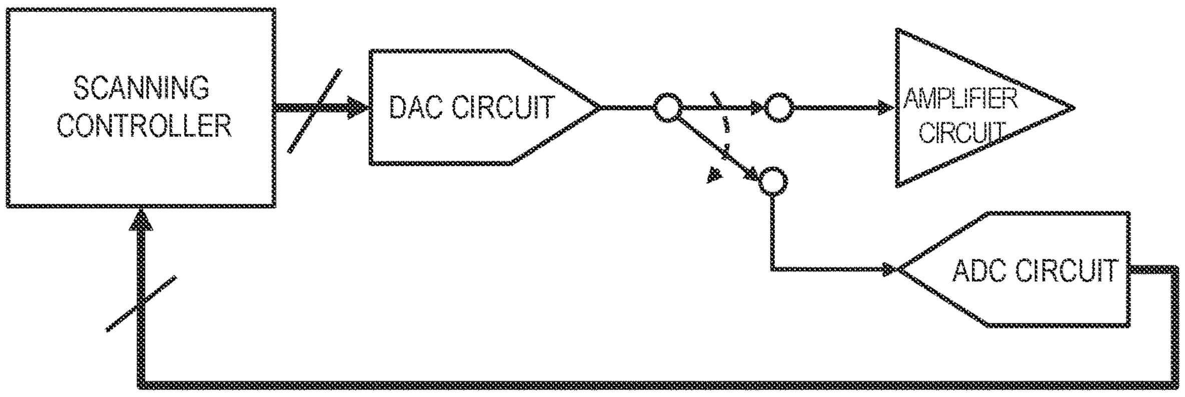
FIG. 1 shows an example of a configuration in the related art for correcting an INL error of a DAC circuit.
Figure 2:
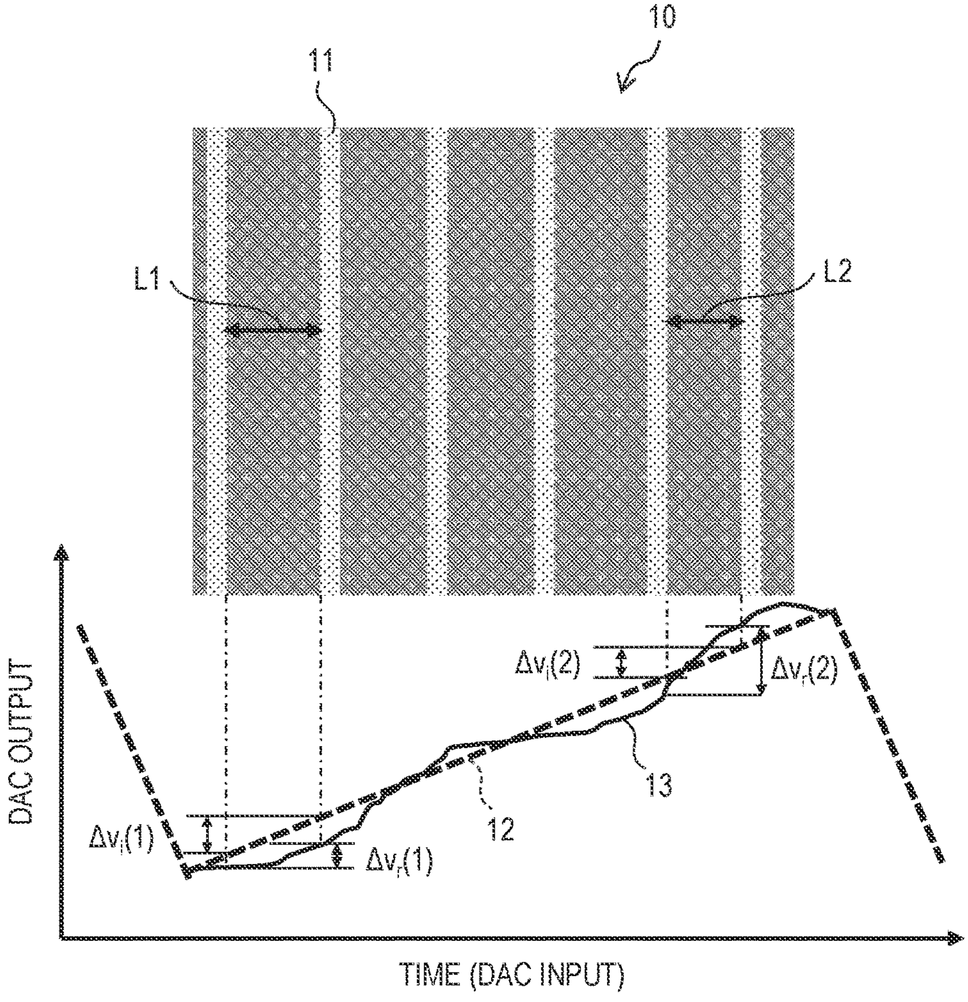
FIG. 2 shows an example of an INL error according to a first embodiment of the present invention.

FIG. 2 shows an example of an INL error that can be corrected by a charged particle beam scanning module according to the first embodiment of the present invention. In a sample 10, patterns 11 are formed at equal intervals in an X axis direction, that is, dimensions L1=L2. A change in a signal when a charged particle beam is used to scan the sample 10 in the X axis direction is shown in a graph.

Although a horizontal axis of the graph represents time, it can also be considered that the horizontal axis represents an input of a DAC circuit. A vertical axis represents an output of the DAC circuit. The output of the DAC circuit increases with time in first scanning along an axis direction (for example, the X axis direction). An ideal output 12 is indicated by a broken line. The ideal output 12 matches an input, that is, a digital signal from a scanning controller, and the ideal output 12 linearly increases. Although the digital signal is actually a fine step-shaped signal, the digital signal is shown as a signal of a straight line in FIG. 2 for the convenience of illustration.

An actual output 13 of the DAC circuit is represented by a solid line in the graph, and includes an INL error. For example, when measuring the dimension L1, it is ideal that an output of the DAC circuit changes by $\Delta v_i(\mathbf{1})$, but the output of the DAC circuit actually changes by $\Delta v_r(\mathbf{1})$ due to an error. In general, $\Delta v_i(\mathbf{1}) \neq \Delta v_r(\mathbf{1})$. Similarly, when measuring the dimension L2, an ideal variation is $\Delta v_i(\mathbf{1})$, but an actual variation is $\Delta v_r(\mathbf{2})$. In general, $\Delta v_i(\mathbf{2}) \neq \Delta v_r(\mathbf{2})$. These errors appear as deflection errors of the charged particle beam and influence the measurement of the dimension L1.

Figure 3:
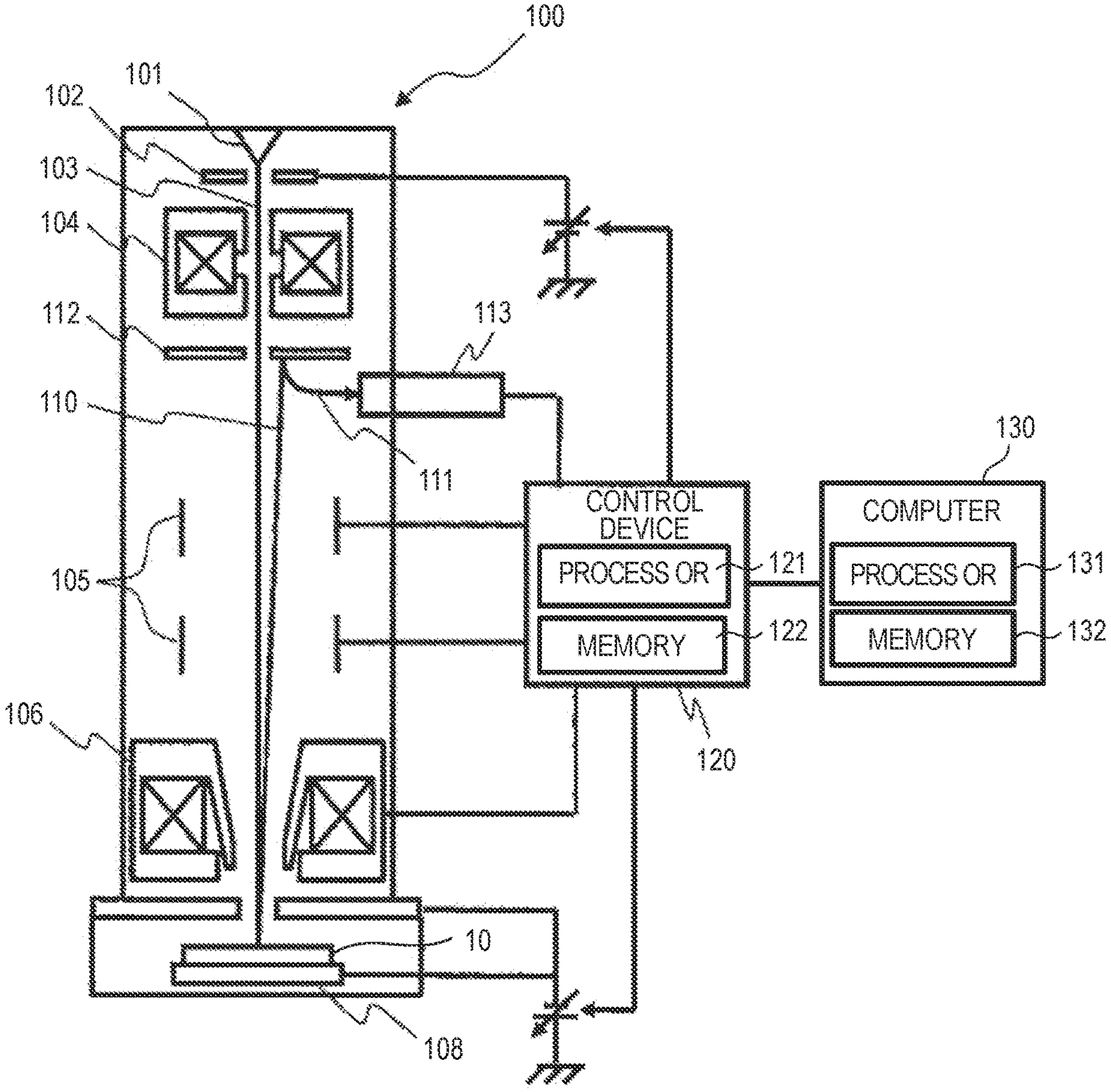
FIG. 3 shows an example of a configuration including a charged particle beam device according to the first embodiment.

FIG. 3 shows an example of a configuration including a charged particle beam device 100 according to the first embodiment. The charged particle beam device 100 is, for example, a scanning electron microscope (SEM), and is not limited thereto.

An electron source 101 (a charged particle source) generates an electron beam 103 (a charged particle beam). The electron beam 103 is extracted by an extraction electrode 102, is accelerated by an acceleration electrode (not shown), is condensed by a condenser lens 104 which is one form of a focusing lens, and then is one-dimensionally or two-dimensionally scanned on the sample 10 by a deflector 105. The electron beam 103 is decelerated by a negative voltage applied to an electrode incorporated in a sample stage 108, is focused by a lens action of an objective lens 106, and is radiated onto the sample 10.

When the sample 10 is irradiated with the electron beam 103, electrons 110 such as secondary electrons and backscattered electrons are emitted from an irradiated portion. The emitted electrons 110 are accelerated in a direction of the electron source 101 by an acceleration action based on the negative voltage applied to the sample, collide with a conversion electrode 112, and generate secondary electrons 111. The secondary electrons 111 emitted from the conversion electrode 112 are captured by a detector 113. In this manner, the detector 113 detects the secondary electrons generated in response to the irradiation on the sample 10 using the electron beam 103. An output of the detector 113 changes in accordance with an amount of the secondary electrons captured by the detector 113. Luminance of a display device (not shown) changes in accordance with the output. For example, in the case of forming a two-dimensional image, a deflection signal to the deflector 105 and the output of the detector 113 are synchronized to form an image of a scanning region.

The charged particle beam device 100 shown in FIG. 3 is a device capable of applying a high voltage (for example, 15 kV or more) to an acceleration electrode (not shown). An electron beam can reach a buried pattern or the like that is not exposed on a sample surface by radiating the electron beam with high acceleration.

Although FIG. 3 shows an example in which electrons emitted from the sample is converted at one end of the conversion electrode and is detected, the present invention is not limited to such a configuration. For example, a configuration may be conceived in which an electron magnification tube or a detection surface of a detector is disposed on a trajectory of accelerated electrons. In addition, the number of the conversion electrode 112 and the number of the detector 113 do not need to be one, and a configuration may be conceived in which a plurality of detection surfaces divided in an azimuth angle direction or an elevation angle direction relative to an optical axis and detectors corresponding to the respective detection surfaces are provided. With such a configuration, it is possible to simultaneously acquire captured images of the same number as the number of the detectors by one-time imaging.

A control device 120 is configured with, for example, a computer, and includes a processor 121 and a memory 122. The memory 122 is a storage medium that stores information. The storage medium may be configured with, for example, a main memory, a flash memory, a hard disk drive (HDD), a magnetoresistive memory (MRAM), or the like. The memory 122 may store a program, and the processor 121 may execute the program so that the control device 120 implements functions and functional units described in the present embodiment.

The control device 120 has, for example, the following functions:

- a function of controlling components of the charged particle beam device 100,
- a function of forming a sample image based on detected secondary electrons (that is, a function serving as a sample image generation device), and
- a function of measuring a pattern width of a pattern formed on the sample (for example, measurement is performed based on an intensity distribution of detected electrons referred to as a line profile).

The control device 120 includes an SEM control device that mainly controls an optical condition of the SEM and a signal processing device that performs a signal processing on a detection signal obtained by the detector 113. The control device 120 includes a charged particle beam scanning module (which will be described later with reference to FIG. 5) for controlling a beam scanning condition (a direction, a speed, and the like).

A computer 130 is connected to the charged particle beam device 100. The computer 130 includes a processor 131 and a memory 132, and can communicate with the charged particle beam device 100. The memory 132 is a storage medium that stores information. The storage medium may be configured with, for example, a main memory, a flash memory, a hard disk drive (HDD), a magnetoresistive memory (MRAM), or the like. The memory 132 may store a program, and the processor 131 may execute the program so that the computer 130 implements functions and functional units described in the present embodiment.

Figure 4A:
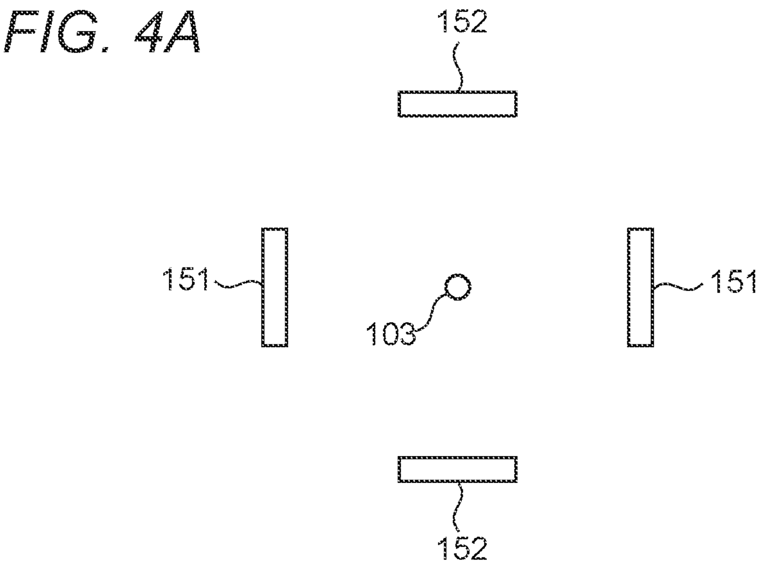
FIGS. 4A and 4B show an example of a specific configuration of a deflector shown in FIG. 3.
Figure 4B:
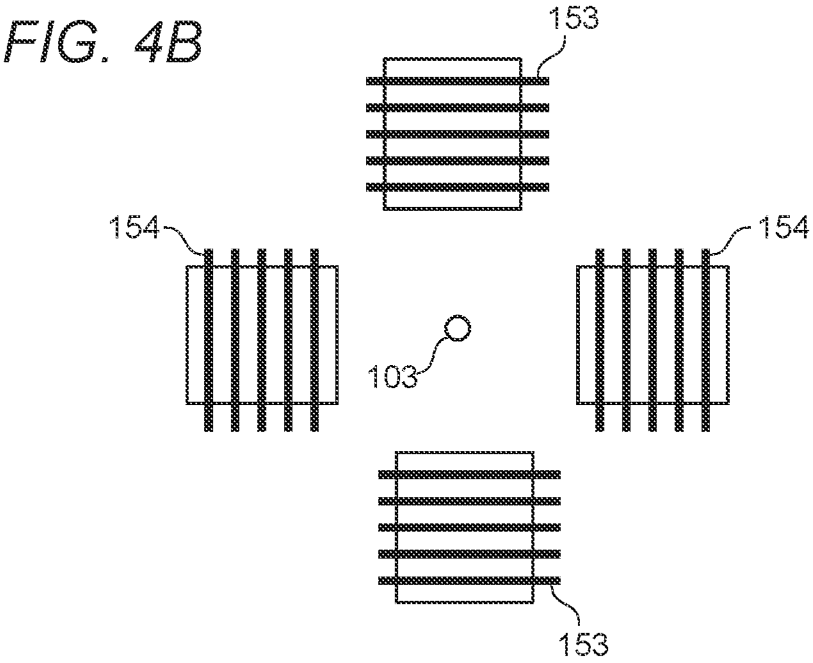

FIGS. 4A and 4B show an example of a specific configuration of the deflector 105. The electron beam 103 is radiated in a positive Z axis direction. FIG. 4A shows a deflector of an electric field type. The deflector of an electric field type includes a first electrode pair 151 and a second electrode pair 152, and deflects charged particles by a Coulomb force. The first electrode pair 151 generates an electric field in the X axis direction, thereby deflecting the electron beam 103 in the X axis direction. The second electrode pair 152 generates an electric field in a Y axis direction, thereby deflecting the electron beam 103 in the Y axis direction.

FIG. 4B shows a deflector of a magnetic field type. The deflector of a magnetic field type includes a first coil pair 153 and a second coil pair 154, and deflects charged particles by a Lorentz force. The first coil pair 153 generates a magnetic field in the Y axis direction and deflects, in the X axis direction, the electron beam 103 radiated in a Z axis direction. The second coil pair 154 generates a magnetic field in the X axis direction and deflects, in the Y axis direction, the electron beam 103 radiated in the Z axis direction.

The deflector of an electric field type and the deflector of a magnetic field type may be used in combination. Further, a specific configuration of the deflector is not limited to the above-described configuration, and for example, any known configuration may be used.

Figure 5:
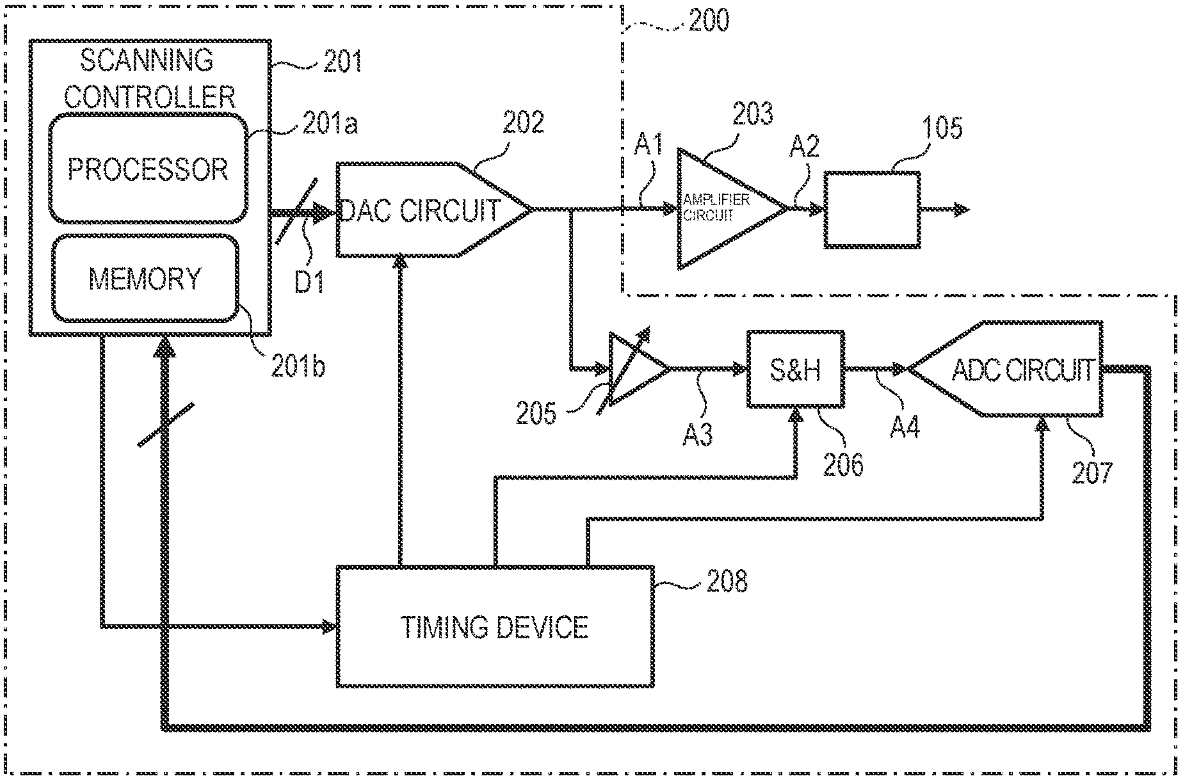
FIG. 5 shows an example of a configuration including a charged particle beam scanning module according to the first embodiment.

FIG. 5 shows an example of a configuration including a charged particle beam scanning module 200. The charged particle beam scanning module 200 includes a scanning controller 201, a DAC circuit 202, a VGA circuit 205, a sampling circuit 206, an ADC circuit 207, and a timing device 208. An amplifier circuit 203 and the deflector 105 are connected to the charged particle beam scanning module 200.

The scanning controller 201 is configured with, for example, a computer, and includes a processor 201*a* and a memory 201*b*. The memory 201*b* is a storage medium that stores information. The storage medium may be configured with, for example, a main memory, a flash memory, a hard disk drive (HDD), a magnetoresistive memory (MRAM), or the like. The memory 201*b* may store a program, and the processor 201*a* may execute the program so that the scanning controller 201 implements functions and functional units described in the present embodiment.

The scanning controller 201 generates and outputs a scanning digital signal D1 of a charged particle beam. The scanning digital signal D1 is a beam control signal, and represents a deflection amount of the charged particle beam in a specific axis direction (for example, the X axis direction or the Y axis direction), that is, corresponds to an irradiation position. The scanning digital signal D1 has accuracy of, for example, 26 bits.

The DAC circuit 202 receives the scanning digital signal D1, converts the scanning digital signal D1 into a scanning analog signal A1, and outputs the scanning analog signal A1. The DAC circuit 202 is, for example, a DAC circuit of ultra-high accuracy, and is capable of coping with accuracy of 26 bits. As a more specific example, upper 14 bits and lower 12 bits of the 26 bits may be converted into analog signals, and results may be added to output a final scanning analog signal A1. The scanning analog signal A1 includes an INL error of the DAC circuit 202 as described above.

The amplifier circuit 203 amplifies the scanning analog signal A1 to generate an amplified scanning analog signal (hereinafter referred to as an "amplified analog signal A2"), and supplies the amplified analog signal A2 to the deflector 105. That is, the scanning analog signal A1 is amplified by the amplifier circuit 203 and then is supplied to the deflector 105 of the charged particle beam. The amplified analog signal A2 is represented by, for example, a voltage or a current.

FIG. 5 shows an example in which the amplifier circuit 203 is provided outside the charged particle beam scanning module 200. Alternatively, the amplifier circuit 203 may be provided inside the charged particle beam scanning module 200 according to a modification. Since such an amplifier circuit 203 is provided, it is not necessary to increase an output of the DAC circuit 202, and a configuration of the DAC circuit 202 can be simplified.

The deflector 105 deflects a charged particle beam based on the amplified analog signal A2 from the amplifier circuit 203.

The VGA circuit 205 is a variable gain amplifier circuit, adjusts the scanning analog signal A1 in accordance with a dynamic range of the ADC circuit 207, and outputs an adjusted scanning analog signal (hereinafter referred to as an "adjusted analog signal A3").

The sampling circuit 206 is, for example, a sample and hold circuit. The sampling circuit 206 holds the adjusted analog signal A3 at a predetermined sampling time, and outputs a held scanning analog signal (hereinafter referred to as a "held analog signal A4") to the ADC circuit 207. That is, the sampling circuit 206 continues to output the held analog signal A4 corresponding to the adjusted analog signal A3 at a time point designated by a hold instruction signal output from the timing device 208 while maintaining the held analog signal A4 at the same value for a predetermined time.

The scanning analog signal A1, the amplified analog signal A2, the adjusted analog signal A3, and the held analog signal A4 are all scanning analog signals, and are signals of the same quality in that the signals include an INL error.

The ADC circuit 207 converts the held analog signal A4 into an evaluation digital signal D2. The evaluation digital signal D2 is substantially a signal in which an INL error is added to the scanning digital signal D1, and can be used for evaluation of the INL error. As a specific example, the INL error can be evaluated based on a difference between the scanning digital signal D1 and the evaluation digital signal D2. The ADC circuit 207 has accuracy corresponding to the accuracy of the DAC circuit 202. The ADC circuit 207 is, for example, an ADC circuit of ultra-high accuracy, and is capable of coping with accuracy of 26 bits.

The timing device 208 supplies a timing signal such that the scanning controller 201, the DAC circuit 202, the sampling circuit 206, the ADC circuit 207, and the like appropriately operate in synchronization with one another.

Figure 6:
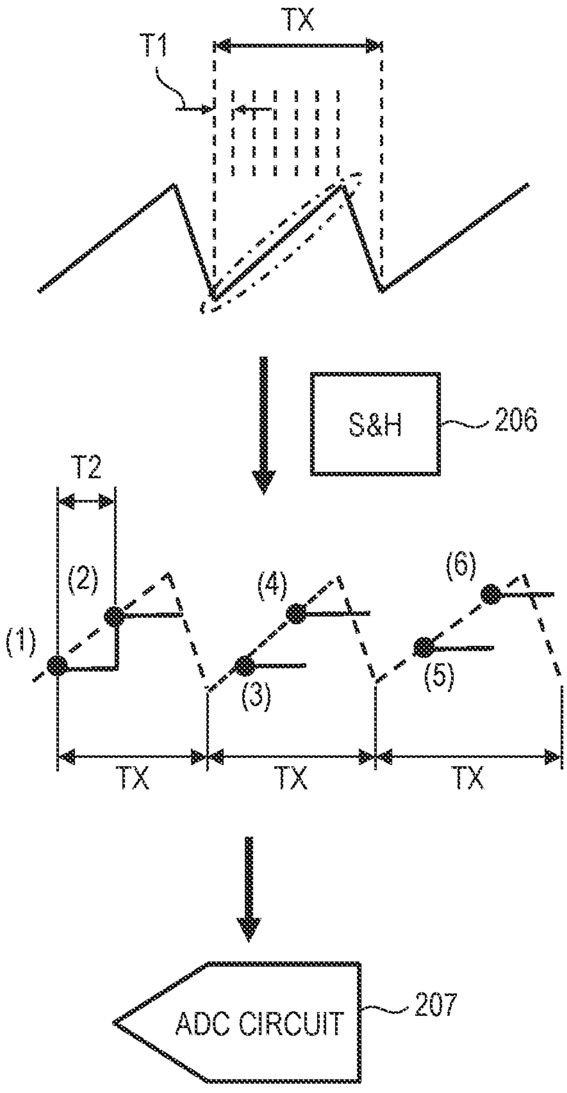
FIG. 6 is a timing chart of signals in the charged particle beam scanning module shown in FIG. 5.

FIG. 6 is a timing chart of signals in the charged particle beam scanning module 200. A dashed-dotted line represents a range corresponding to one-time scanning, and the sample 10 is two-dimensionally scanned for a plurality of times. The one-time scanning corresponds to a repetition cycle TX of the scanning digital signal D1. A repetition frequency (a third frequency) is proportional to a reciprocal of the repetition cycle TX, and for example, when the repetition cycle TX is c [sec], the repetition frequency is 1/c [Hz].

A sampling cycle T1 represents a cycle in which the DAC circuit 202 samples the scanning digital signal D1. A sampling frequency (a first frequency) is proportional to a reciprocal of the sampling cycle T1, and for example, when the sampling cycle T1 is a [sec], the sampling frequency is 1/a [Hz].

The sampling cycle T1 may be, for example, a time defined as a time during which an input signal needs to be maintained constant in the specification of the DAC circuit 202. Alternatively, the sampling cycle T1 may be a time during which an input value for the DAC circuit 202 is actually maintained constant.

A sampling cycle T2 represents a cycle in which the ADC circuit 207 samples the held analog signal A4. A sampling frequency (a second frequency) is proportional to a reciprocal of the sampling cycle T2, and for example, when the sampling cycle T2 is b [sec], the sampling frequency is 1/b [Hz].

The sampling cycle T2 may be, for example, a time defined as a time during which an input signal needs to be maintained constant in the specification of the ADC circuit 207. Alternatively, the sampling cycle T2 may be a time during which an input value for the ADC circuit 207 is actually maintained constant.

The sampling circuit 206 receives the adjusted analog signal A3 and the hold instruction signal output from the timing device 208 at the same cycle as the sampling cycle T2, that is, at the second frequency, and continues to output the held analog signal A4 corresponding thereto. As described above, since a scanning analog signal to be converted by the ADC circuit 207 is the held analog signal A4 output from the sampling circuit 206, a value of the signal is maintained for at least a time required for a conversion operation of the ADC circuit 207.

The sampling cycle T2 of the ADC circuit 207 is longer than the sampling cycle T1 of the DAC circuit 202. That is, the second frequency is smaller than the first frequency. In general, a conversion operation of the ADC circuit 207 takes a longer time than a conversion operation of the DAC circuit 202. As described above, the second frequency is designed to be smaller than the first frequency, so that a time required for the conversion operation of the ADC circuit 207 can be ensured.

(1) to (6) in FIG. 6 show sampling times of the sampling circuit 206. The times (1) and (2) belong to a first repetition cycle TX, the times (3) and (4) belong to a second repetition cycle TX, and the times (5) and (6) belong to a third repetition cycle TX. The sampling cycle T2 of the ADC circuit 207 is longer than the sampling cycle T1 of the DAC circuit 202. The sampling cycle T2 is different from the repetition cycle TX. That is, the scanning digital signal D1 is repeated at the third frequency different from the second frequency. The third frequency may be a value different from an integer multiple of the second frequency and a value different from an integer fraction of the second frequency.

Although the sampling cycle T2 is shorter than the repetition cycle TX in the example shown in FIG. 6, the sampling cycle T2 may be a time longer than the repetition cycle TX in a modification. Although sampling is performed about twice in one repetition cycle TX in the example shown in FIG. 6, a sampling frequency can be appropriately designed.

The charged particle beam scanning module 200 according to the present embodiment can scan a sample with a charged particle beam and generate the evaluation digital signal D2 in parallel. Here, as shown in FIG. 6, since the scanning analog signal A1 is held as the held analog signal A4 via the VGA circuit 205 and the sampling circuit 206, even when the scanning digital signal D1 changes at high speed, a conversion operation of the ADC circuit 207 can be accurately performed. In other words, it is not necessary to increase the sampling cycle T1 of the scanning digital signal D1 in accordance with the sampling cycle T2 of the ADC circuit 207, and it is possible to evaluate an INL error in real time. The term "in real time" refers to that, for example, evaluation of the INL error and scanning on a sample using a charged particle beam are performed in parallel.

Figure 7:
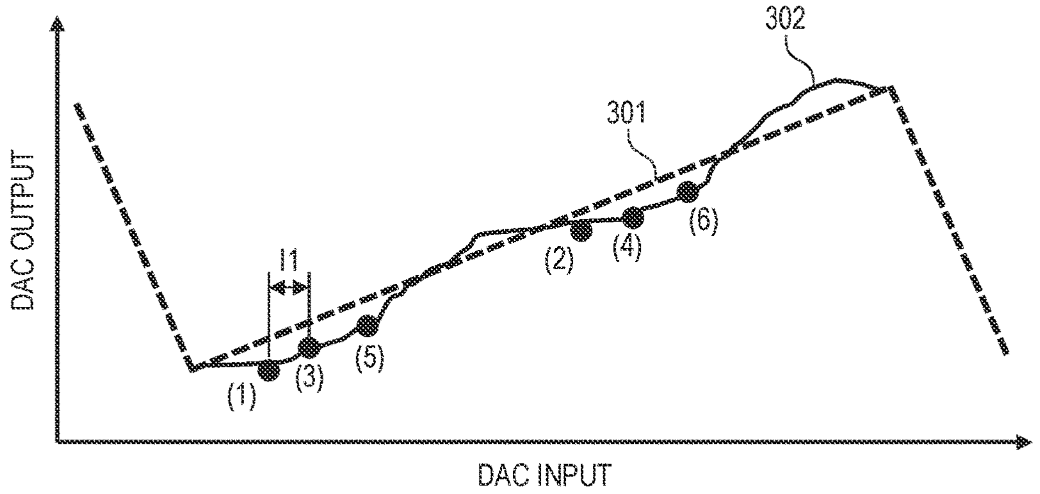
FIG. 7 shows an example of an output characteristic of a DAC circuit shown in FIG. 5.

FIG. 7 shows an example of an output characteristic of the DAC circuit 202. A horizontal axis represents an input, that is, a value of the scanning digital signal D1, and a vertical axis represents an output, that is, a value of the scanning analog signal A1.

In the example shown in FIG. 6, sampling times dispersed in different repetition cycles are arranged in accordance with values of the scanning digital signal D1 in FIG. 7, that is, equivalently, the sampling times are gathered in one repetition cycle. A broken line corresponds to an ideal value 301, that is, a value in proportion to the scanning digital signal D1, and a solid line corresponds to a measured value 302, that is, a value of the scanning analog signal A1.

Since the sampling cycle T2 is different from the repetition cycle TX and is different from, for example, an integer multiple of the repetition cycle TX and an integer fraction of the repetition cycle TX, the initial sampling times (1), (3), and (5) in respective repetition cycles TX respectively correspond to different values of the scanning digital signal D1. Similarly, the second time sampling times (2), (4), and (6) in respective repetition cycles TX respectively correspond to different values of the scanning digital signal D1. A difference among the sampling times in FIG. 7 is an equivalent interval I1. The equivalent interval I1 may be any value (for example, a time shorter than the sampling cycles T1 and T2) by determining a value of the sampling cycle T2 in accordance with the repetition cycle TX.

As described above, since the scanning controller 201 generates the scanning digital signal D1 which is repeated at the third frequency (corresponding to the repetition cycle TX) different from the second frequency (corresponding to the sampling cycle T2), it is possible to perform sampling at a higher frequency (at a substantial shorter interval I1) in accordance with a difference between the third frequency and the second frequency.

Here, it can be said that a relationship between the scanning digital signal D1 and the scanning analog signal A1 represents an output characteristic of the DAC circuit 202. For example, when a value at a time (1) in FIG. 7 is input to the DAC circuit 202 as the scanning digital signal D1, the DAC circuit 202 outputs a value corresponding to the scanning analog signal A1 at the same time (1) in FIG. 7.

In this manner, the scanning controller 201 can determine the output characteristic of the DAC circuit 202 based on the scanning digital signal D1 and the scanning analog signal A1 (more strictly, based on the evaluation digital signal D2 corresponding to the scanning analog signal A1). That is, the scanning controller 201 can determine the output characteristic of the DAC circuit 202 by evaluating the scanning digital signal D1 and the evaluation digital signal D2.

For example, an expression format of information indicating the output characteristic can be designed freely, and the information may be expressed as a table in which a value of the scanning digital signal D1 and a value of the scanning analog signal A1 or the evaluation digital signal D2 are associated with each other. Alternatively, for example, the information may be expressed as a table in which the value of the scanning digital signal D1 and a difference between the scanning digital signal D1 and the evaluation digital signal D2 are associated with each other.

Since one measurement cycle of one output characteristic, that is, a cycle required to measure all values corresponding to times (1) to (6) shown in FIG. 7 extends in a plurality of repetition cycles TX as shown in FIG. 6, the measurement cycle is a time longer than duration time of the repetition cycle TX. The measurement cycle of the output characteristic may be matched with, for example, a period in which one sample image is captured (that is, a two-dimensional repetition cycle), or may be matched with a period in which a plurality of sample images are captured. The measurement cycle of the output characteristic can be set within a range of, for example, 1 ms to 10 ms.

The determined output characteristic of the DAC circuit 202 can be used to correct an INL error in the DAC circuit 202. In the present embodiment, the scanning controller 201 corrects an output of the DAC circuit 202 based on the output characteristic of the DAC circuit 202.

Figure 8:
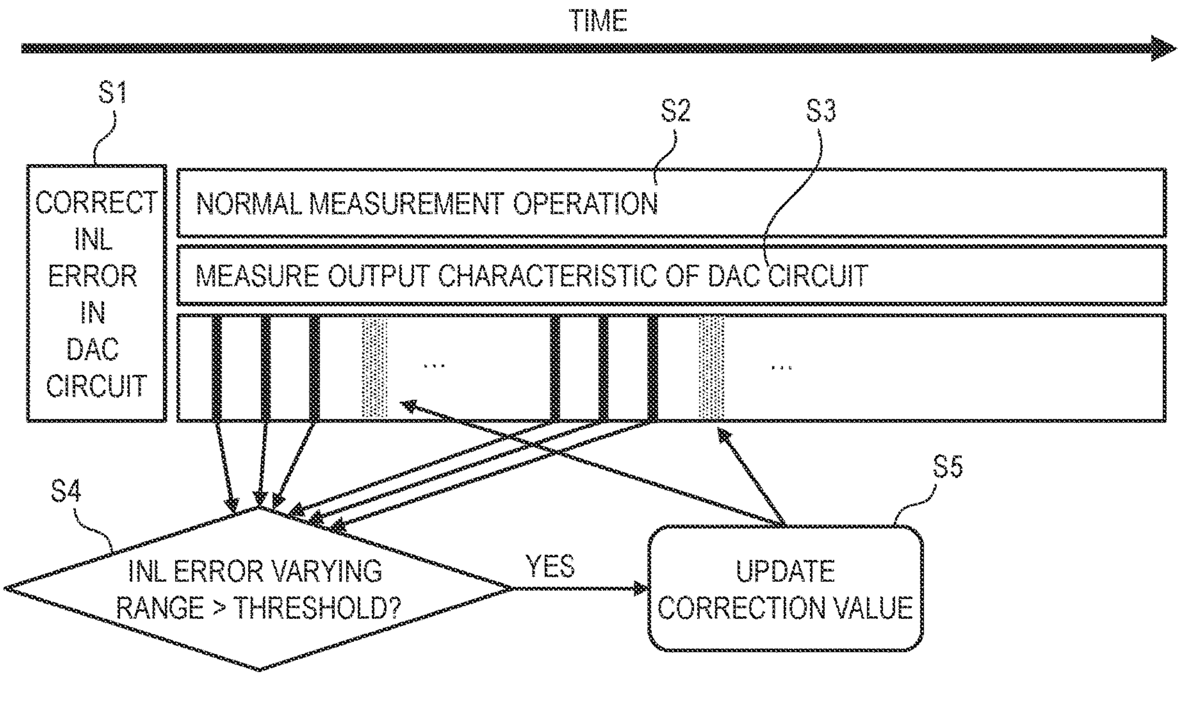
FIG. 8 shows an example of a flow of a correction operation according to the first embodiment.

FIG. 8 shows an example of a flow of a correction operation according to the first embodiment. First, a correction on the INL error in the DAC circuit 202 is performed (step S1). This correction can be performed before an imaging operation is started, and the correction operation can be performed with high accuracy. Alternatively, this correction may be omitted.

Next, for example, a charged particle beam for imaging is used to perform scanning as a normal measurement operation (step S2). This scanning is performed using the corrected scanning analog signal A1. For example, the scanning controller 201 determines a correction value for correcting the scanning analog signal A1 based on the output characteristic (a first output characteristic) acquired before step S2, and corrects the scanning analog signal A1 in accordance with the correction value.

As a specific method of implementing the correction, for example, the DAC circuit 202 may adjust and output the scanning analog signal A1 in accordance with an instruction from the scanning controller 201, or an appropriate circuit (not shown) for correcting the scanning analog signal A1 output from the DAC circuit 202 may be separately provided.

The output characteristic of the DAC circuit 202 is measured in parallel with the normal measurement operation (step S2), that is, in real time (step S3). That is, the INL error is measured, and a measurement result is stored in the memory 201*b*. In other words, the scanning controller 201 causes the ADC circuit 207 to output the corrected scanning analog signal A1 in parallel with the determination of the output characteristic of the DAC circuit 202.

In parallel with the operations, the scanning controller 201 determines the INL error (step S4). For example, it is determined whether a difference (a varying range) between the corrected INL error and an INL error in a newly measured output characteristic (a second output characteristic) is larger than a predetermined threshold. That is, a difference between the above-described first output characteristic and the second output characteristic determined after the first output characteristic is calculated, and it is determined whether the difference is larger than a predetermined threshold.

A method of calculating the varying range can be appropriately designed by a person skilled in the art. For example, the varying range can be expressed using an absolute value of a difference between the scanning digital signal D1 and the evaluation digital signal D2 or using a square of the difference.

When it is determined in step S4 that the difference is larger than the predetermined threshold, the scanning controller 201 updates the correction value (step S5). For example, a correction value is newly calculated based on the newly measured output characteristic (the second output characteristic), the correction value is updated according to the newly calculated correction value, and an image acquired thereafter is corrected based on the updated new correction value. The new correction value serves as a comparison reference when step S4 is performed subsequently. A specific method of using the correction value can be appropriately designed by a person skilled in the art, and can be, for example, a method to be described in second to fourth embodiments which will be described later.

When it is determined in step S4 that the varying range does not exceed the threshold, step S5 is not performed.

Step S4 can be performed, for example, at a predetermined interval. This interval can be set within a range of, for example, 1 second to 10 seconds. Alternatively, step S4 can be performed each time a measurement position or an imaging position changes.

According to such an operation, a correction value of the INL error in the DAC circuit 202 can be updated at an appropriate timing using the output characteristic of the DAC circuit 202 acquired in real time. Accordingly, for example, an appropriate correction can be performed in accordance with both an INL error (which varies in a unit of several seconds) depending on temperature and a temporal change (which varies in a unit of several days) of the DAC circuit 202.

As described above, according to the charged particle beam scanning module and the charged particle beam device of the first embodiment, since the output characteristic of the DAC circuit 202 can be determined in parallel with the scanning using the charged particle beam, the INL error in the DAC circuit 202 can be corrected in real time. As a result, it is possible to achieve both highly accurate scanning using the charged particle beam and high throughput of imaging.

Second Embodiment

The second embodiment is different from the first embodiment in that the correction of the INL error is performed based on a sample image. Hereinafter, description of portions common to those of the first embodiment may be omitted.

In the second embodiment, the scanning controller 201 transmits a captured sample image and information indicating the output characteristic to the computer 130 (FIG. 3). The processor 131 of the computer 130 receives the sample image and the information indicating the output characteristic of the DAC circuit 202 from the charged particle beam device 100 (that is, from the scanning controller 201), and stores the sample image and the information in the memory 132.

The processor 131 acquires a measured length value by measuring a dimension of a pattern (length measurement target pattern) appearing in a specific part of the sample image based on the received sample image. Thereafter, the processor 131 corrects the measured length value based on the output characteristic of the DAC circuit 202.

For example, the output characteristic has the contents shown in FIG. 2. Measured length values of N parts (N is an integer of 1 or more) are acquired from the sample image. When an acquired measured length value of an n-th pattern (n is an integer satisfying $1 \leq n \leq N$) is $L(n)_m$, a measured length value $L(n)_{com}$ after a correction for the pattern can be expressed as follows.

$$L(n)_{com} = A \times L(n)_m \times \Delta v_r(n) / \Delta v_i(n)$$

A is an adjustment coefficient and represents an optical condition or the like. $\Delta v_r(n)$ represents an actual deflection voltage amount in the n-th pattern, that is, represents an amount of a voltage changed when a charged particle beam is deflected from one end of the pattern to the other end of the pattern. $\Delta v_i(n)$ represents an ideal deflection voltage amount (or an expected deflection voltage amount) in the n-th pattern, that is, represents an amount of a voltage to be originally changed when a charged particle beam is deflected from one end of the pattern to the other end of the pattern.

In the present embodiment, it can be said that the output characteristic of the DAC circuit 202 represents a relationship between $\Delta v_r(n)$ and $\Delta v_i(n)$ at a position corresponding to each pattern. A value of $v_r(n)$ can be obtained with high accuracy by designing the equivalent interval I1 shown in FIG. 7 to be small.

As described above, in the second embodiment, the charged particle beam scanning module 200 receives information about secondary electrons generated in response to irradiation on a sample using a charged particle beam, generates a sample image based on the information, and transmits the sample image to the computer 130. The processor 131 of the computer 130 receives the sample image, measures a dimension (a measured length value) of the sample based on the sample image, and corrects the measured length value based on the output characteristic of the DAC circuit 202. In this manner, a measurement based on the sample image and a correction based on the output characteristic can be combined to perform a measurement with high accuracy.

As described above, according to the second embodiment, it is possible to correct a variation in a length value measurement result of a pattern, that is, it is possible to correct expansion and contraction of a measured length value due to an INL error.

The correction in the second embodiment is not necessarily performed by the processor 131 or the computer 130, and may be performed by the charged particle beam scanning module 200 (for example, the scanning controller 201) or the charged particle beam device 100 (for example, the control device 120). In this case, the scanning controller 201 does not need to transmit the sample image and the information indicating the output characteristic to the computer 130.

Third Embodiment

The third embodiment is different from the second embodiment in that a correction is performed in a plurality of axis directions. Hereinafter, description of portions common to those of the first or the second embodiment may be omitted.

Figures 9, 10:
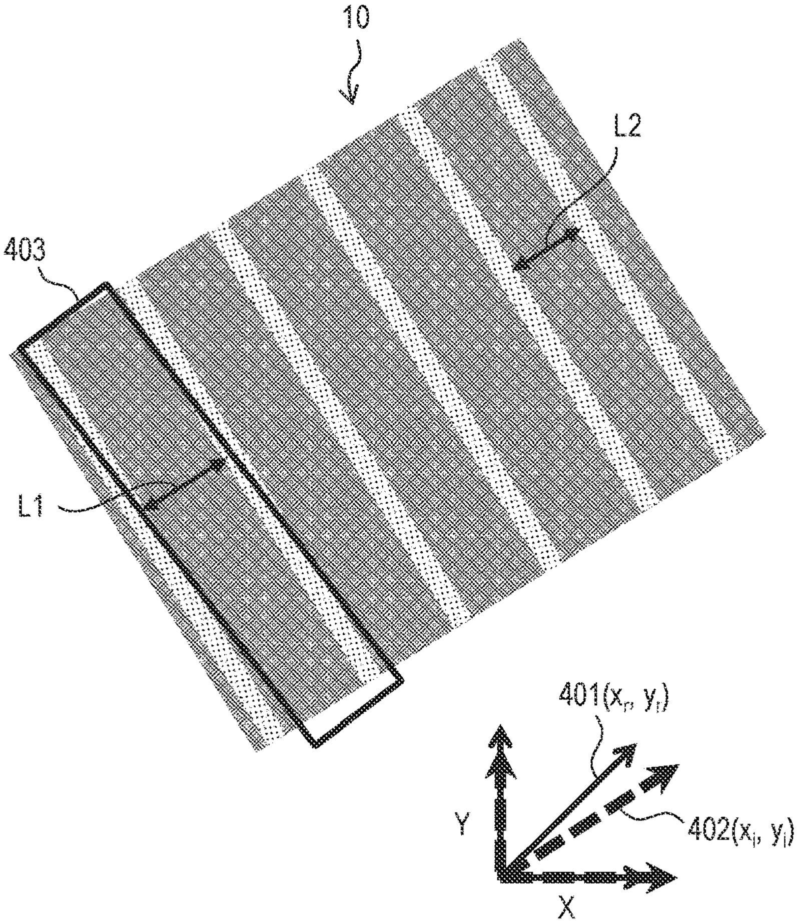
FIG. 9 shows an outline of a correction processing according to a third embodiment of the present invention.
FIG. 10 shows an example of positional deviation information according to a fourth embodiment of the present invention.

FIG. 9 shows an outline of a correction processing according to the third embodiment. In the third embodiment, the scanning controller 201 determines output characteristics of the DAC circuit 202 in both a first direction and a second direction that are orthogonal to each other. Hereinafter, an X direction is used as an example of the first direction, and a Y direction is used as an example of the second direction.

A method of acquiring the output characteristics in the two directions in parallel can be appropriately designed by a person skilled in the art based on the description of the first embodiment, a known technique, and the like. For example, scanning in the X direction is performed at a certain Y position, and then scanning in the X direction is performed at a next Y position obtained by moving the Y position by a certain unit. By repeating this operation and scanning the Y position from a minimum value to a maximum value, the output characteristic in the Y direction can be acquired in parallel with the output characteristic in the X direction.

For example, for a vector representing a pixel position, an accurate position 402 may be measured as a position 401 including an error due to an influence of an INL error.

Similar to the second embodiment, the processor 131 of the computer 130 receives information about secondary electrons generated in response to irradiation on a sample using a charged particle beam, stores the information in the memory 132, and generates a sample image based on the information.

The processor 131 receives information indicating the output characteristics of the DAC circuit 202. For example, the output characteristic is determined for each of the X direction and the Y direction, and the information indicating the output characteristics includes information indicating the output characteristic in the X direction and information indicating the output characteristic in the Y direction. The processor 131 corrects the sample image based on an output characteristic. For example, a luminance or a pixel position in the X direction is corrected based on the output characteristic in the X direction, and a luminance or a pixel position in the Y direction is corrected based on the output characteristic in the Y direction.

A specific calculation processing for a correction can be appropriately designed by a person skilled in the art, and an example of such a calculation processing will be described as follows. A distance $x_r$ in the X direction and a distance $y_r$ in the Y direction from a predetermined reference point (for example, an origin in the image) to the position 401 ($x_r$, $y_r$) including an error are corrected in the same manner as that in the second embodiment, and the accurate position 402 ($x_i$, $y_i$) is calculated as a corrected position. Then, a luminance value of a pixel at the accurate position 402 ($x_i$, $y_i$) is matched with a luminance value measured at the position 401 ($x_r$, $y_r$) including the error. Such a processing is repeated for all measurement positions (or all pixel positions). An appropriate interpolation processing may be performed. In this manner, the sample image is corrected.

The processor 131 outputs the corrected sample image. For example, as an output form, the corrected sample image output from the processor 131 may be stored in the memory 132, may be displayed on a display device (not shown), or may be transmitted to another computer via a communication network.

According to such a correction, for example, in a case where a rectangular pattern of the sample 10 is imaged in a manner of being inclined as in an actually measured shape 403, it is possible to two-dimensionally correct the inclination and acquire an accurate sample image.

The correction in the third embodiment is not necessarily performed by the processor 131 or the computer 130, and may be performed by the charged particle beam scanning module 200 (for example, the scanning controller 201) or the charged particle beam device 100 (for example, the control device 120). In this case, the scanning controller 201 does not need to transmit the sample image and the information indicating the output characteristics to the computer 130.

Fourth Embodiment

The fourth embodiment is different from the second embodiment in that a correction is performed in a plurality of axis directions and a sample image and positional deviation information are output. Hereinafter, description of portions common to any one of the first to third embodiments may be omitted.

Similar to the second and the third embodiments, the processor 131 of the computer 130 receives information about secondary electrons generated in response to irradiation on a sample using a charged particle beam, stores the information in the memory 132, and generates a sample image based on the information. Then, the processor 131 generates positional deviation information in the X direction and positional deviation information in the Y direction at a predetermined position (for example, all pixel positions) of the sample image based on the output characteristic in the X direction and the output characteristic in the Y direction.

FIG. 10 shows an example of the positional deviation information according to the fourth embodiment. A size of the sample image in the X direction is denoted by n, a size in the Y direction is denoted by m, and the positional deviation information of a pixel at a position (i, j) is represented by Pij (δX, δY) ($1 \le i \le n$, $1 \le j \le m$). For example, an expression P11 (δX, δY) represents a difference between a position including an error and an accurate position at a reference point (for example, a lower left point) of the sample image.

In FIG. 10, the positional deviation information for the entire sample image is expressed in a matrix format, but in practice, each element, that is, the positional deviation information Pij (δX, δY) at each position shown in FIG. 10 is a vector. The difference between the position including the error and the accurate position can be expressed as ($x_i - x_r$, $y_i - y_r$) in the example shown in FIG. 9. In this case, the positional deviation information in the X direction corresponds to $x_i - x_r$, and the positional deviation information in the Y direction corresponds to $y_i - y_r$.

The processor 131 outputs the positional deviation information in the X direction and the positional deviation information in the Y direction. The processor 131 outputs a sample image (that is, a sample image before a correction). For example, as an output form, the sample image output from the processor 131 may be stored in the memory 132, may be displayed on a display device (not shown), or may be transmitted to another computer via a communication network.

In this manner, the positional deviation information can be used in any form and the degree of freedom is increased, by outputting the sample image and the positional deviation information as a set (that is, in combination). For example, a user who has acquired the sample image and the positional deviation information may measure a length based on the sample image and correct a length measurement result based on the positional deviation information as in the first embodiment, or may correct the sample image and measure a length based on the corrected sample image as in the third embodiment.

The correction in the fourth embodiment is not necessarily performed by the processor 131 or the computer 130, and may be performed by the charged particle beam scanning module 200 (for example, the scanning controller 201) or the charged particle beam device 100 (for example, the control device 120). In this case, the scanning controller 201 does not need to transmit the sample image and the information indicating the output characteristics to the computer 130.

What is claimed is:

1. A charged particle beam scanning module comprising:

a scanning controller configured to output a scanning digital signal of a charged particle beam;

a DAC circuit configured to convert the scanning digital signal into a scanning analog signal and output the scanning analog signal; and an ADC circuit configured to convert the scanning analog signal into an evaluation digital signal, wherein a sampling frequency at which the DAC circuit samples the scanning digital signal is a first frequency, wherein a sampling frequency at which the ADC circuit samples the scanning analog signal is a second frequency smaller than the first frequency, and wherein the scanning controller determines an output characteristic of the DAC circuit based on the scanning digital signal and the evaluation digital signal, the output characteristic indicating a relationship between the scanning digital signal and the evaluation digital signal.

2. The charged particle beam scanning module according to claim 1, wherein the scanning analog signal is amplified by an amplifier circuit provided inside or outside the charged particle beam scanning module, and then is supplied to a deflector of the charged particle beam.

3. The charged particle beam scanning module according to claim 1, further comprising:

a sample and hold circuit, wherein the sample and hold circuit receives the scanning analog signal and a hold instruction signal at the second frequency, wherein the sample and hold circuit continues to output the scanning analog signal at a time point designated by the hold instruction signal, and wherein the scanning analog signal to be converted by the ADC circuit is a signal output from the sample and hold circuit.

4. The charged particle beam scanning module according to claim 1, wherein the scanning controller generates the scanning digital signal that is repeated at a third frequency different from the second frequency.

5. The charged particle beam scanning module according to claim 1, wherein the scanning controller corrects the scanning analog signal based on the output characteristic, and wherein the scanning controller causes the ADC circuit to output a corrected scanning analog signal in parallel with the determination of the output characteristic of the DAC circuit.

6. The charged particle beam scanning module according to claim 5, wherein the scanning controller is configured to:

determine a correction value for correcting the scanning analog signal based on a first output characteristic, calculate a difference between the first output characteristic and a second output characteristic determined after the first output characteristic, and update the correction value based on the second output characteristic when the difference is larger than a predetermined threshold.

7. The charged particle beam scanning module according to claim 1, wherein the output characteristic is expressed as a table in which a value of the scanning digital signal and a value of the evaluation digital signal are associated with each other or a table in which the value of the scanning digital signal and a difference between the scanning digital signal and the evaluation digital signal are associated with each other.

8. A charged particle beam device comprising:

a charged particle beam scanning module, wherein the charged particle beam scanning module includes:

a scanning controller configured to output a scanning digital signal of a charged particle beam, a DAC circuit configured to convert the scanning digital signal into a scanning analog signal and output the scanning analog signal, and an ADC circuit configured to convert the scanning analog signal into an evaluation digital signal, wherein a sampling frequency at which the DAC circuit samples the scanning digital signal is a first frequency, wherein a sampling frequency at which the ADC circuit samples the scanning analog signal is a second frequency smaller than the first frequency, and wherein the scanning controller determines an output characteristic of the DAC circuit based on the scanning digital signal and the evaluation digital signal, the output characteristic indicating a relationship between the scanning digital signal and the evaluation digital signal, wherein the charged particle beam device further comprises:

a charged particle source configured to generate the charged particle beam;

a detector configured to detect secondary electrons generated in response to irradiation on a sample using the charged particle beam; and a memory coupled to a processor, the memory storing instructions that when executed by the processor configures the processor to generate a sample image based on the detected secondary electrons.

9. The charged particle beam device according to claim 8, wherein the scanning analog signal is amplified by an amplifier circuit provided inside or outside the charged particle beam scanning module, and then is supplied to a deflector of the charged particle beam.

10. The charged particle beam device according to claim 8, wherein the charged particle beam scanning module includes a sample and hold circuit, wherein the sample and hold circuit receives the scanning analog signal and a hold instruction signal at the second frequency, wherein the sample and hold circuit continues to output the scanning analog signal at a time point designated by the hold instruction signal, and wherein the scanning analog signal to be converted by the ADC circuit is a signal output from the sample and hold circuit.

11. The charged particle beam device according to claim 8, wherein the scanning controller generates the scanning digital signal that is repeated at a third frequency different from the second frequency.

12. The charged particle beam device according to claim 8, wherein the scanning controller corrects the scanning analog signal based on the output characteristic, and wherein the scanning controller causes the ADC circuit to output a corrected scanning analog signal in parallel with the determination of the output characteristic of the DAC circuit.

13. The charged particle beam device according to claim 12, wherein the scanning controller is configured to:

determine a correction value for correcting the scanning analog signal based on a first output characteristic, calculate a difference between the first output characteristic and a second output characteristic determined after the first output characteristic, and update the correction value based on the second output characteristic when the difference is larger than a predetermined threshold.

14. The charged particle beam device according to claim 8, wherein the output characteristic is expressed as a table in which a value of the scanning digital signal and a value of the evaluation digital signal are associated with each other or a table in which the value of the scanning digital signal and a difference between the scanning digital signal and the evaluation digital signal are associated with each other.

15. A computer configured to communicate with a charged particle beam device, wherein the charged particle beam device includes a charged particle beam scanning module, wherein the charged particle beam scanning module includes:

a scanning controller configured to output a scanning digital signal of a charged particle beam, a DAC circuit configured to convert the scanning digital signal into a scanning analog signal and output the scanning analog signal, and an ADC circuit configured to convert the scanning analog signal into an evaluation digital signal, wherein a sampling frequency at which the DAC circuit samples the scanning digital signal is a first frequency, wherein a sampling frequency at which the ADC circuit samples the scanning analog signal is a second frequency smaller than the first frequency, wherein the scanning controller determines an output characteristic of the DAC circuit based on the scanning digital signal and the evaluation digital signal, the output characteristic indicating a relationship between the scanning digital signal and the evaluation digital signal, wherein the charged particle beam device further includes:

a charged particle source configured to generate the charged particle beam, a detector configured to detect secondary electrons generated in response to irradiation on a sample using the charged particle beam, and a memory coupled to a processor, the memory storing instructions that when executed by the processor configures the processor to generate a sample image based on the detected secondary electrons, wherein the computer comprises:

a storage medium configured to store information; and a processor, and wherein the processor is configured to receive the sample image and information indicating the output characteristic from the charged particle beam device.

16. The computer according to claim 15, wherein the processor is configured to correct the sample image based on the output characteristic.

17. The computer according to claim 15, wherein the output characteristic is expressed as a table in which a value of the scanning digital signal and a value of the evaluation digital signal are associated with each other or a table in which the value of the scanning digital signal and a difference between the scanning digital signal and the evaluation digital signal are associated with each other.

* * * * *